(12) United States Patent
Chen et al.

(10) Patent No.: US 10,573,807 B2
(45) Date of Patent: *Feb. 25, 2020

(54) PHASE CHANGE MEMORY ELEMENT

(71) Applicant: GULA CONSULTING LIMITED LIABILITY COMPANY, Dover, DE (US)

(72) Inventors: Frederick T. Chen, Hsinchu (TW); Ming-Jinn Tsai, Hsinchu (TW)

(73) Assignee: GULA CONSULTING LIMITED LIABILITY COMPANY, Wilmington, DE (US)

( * ) Notice: Subject to any disclaimer, the term of this patent is extended or adjusted under 35 U.S.C. 154(b) by 84 days.

This patent is subject to a terminal disclaimer.

(21) Appl. No.: 15/837,999

(22) Filed: Dec. 11, 2017

(65) Prior Publication Data

US 2018/0375020 A1 Dec. 27, 2018

Related U.S. Application Data

(60) Continuation of application No. 15/655,134, filed on Jul. 20, 2017, now Pat. No. 9,847,479, which is a
(Continued)

(51) Int. Cl.
*H01L 45/00* (2006.01)
*H01L 27/24* (2006.01)

(52) U.S. Cl.
CPC ............ *H01L 45/06* (2013.01); *H01L 27/24* (2013.01); *H01L 27/2409* (2013.01);
(Continued)

(58) Field of Classification Search
CPC ... H01L 31/0324; H01L 45/06; H01L 45/141; H01L 2924/0111; H01L 2924/055
See application file for complete search history.

(56) References Cited

U.S. PATENT DOCUMENTS

| 5,933,365 A | 8/1999 | Klersy et al. |
| 6,613,604 B2 | 9/2003 | Maimon et al. |
(Continued)

FOREIGN PATENT DOCUMENTS

| CN | 1819297 A | 8/2006 |
| CN | 1879234 A | 12/2006 |
(Continued)

OTHER PUBLICATIONS

J.H. Yi et al., "Novel Cell Structure of PRAM With Thin Metal Layer Inserted GeSbTe", IEEE, IEDM '03 Technical Digest, 2003, p. 901-904.
(Continued)

*Primary Examiner* — Hoai V Pham
(74) *Attorney, Agent, or Firm* — Schwabe, Williamson & Wyatt

(57) ABSTRACT

A phase-change memory element is provided. The phase-change memory element may include an electrode; a phase-change material that contacts the electrode; a first conductor that contacts the phase-change material; and a second conductor that contacts the phase-change material. The second conductor may be electrically connected to the first conductor only through the phase-change material, and each of the first and second conductors may be electrically connected to the electrode only through the phase-change material.

20 Claims, 8 Drawing Sheets

Related U.S. Application Data continuation of application No. 14/981,075, filed on Dec. 28, 2015, now Pat. No. 9,735,352, which is a continuation of application No. 14/522,057, filed on Oct. 23, 2014, now Pat. No. 9,245,924, which is a division of application No. 14/062,793, filed on Oct. 24, 2013, now Pat. No. 8,884,260, which is a division of application No. 12/269,282, filed on Nov. 12, 2008, now Pat. No. 8,604,457.

(52) U.S. Cl.
CPC ........ *H01L 27/2436* (2013.01); *H01L 45/122* (2013.01); *H01L 45/124* (2013.01); *H01L 45/128* (2013.01); *H01L 45/1226* (2013.01); *H01L 45/1233* (2013.01); *H01L 45/1246* (2013.01); *H01L 45/1253* (2013.01); *H01L 45/14* (2013.01); *H01L 45/144* (2013.01); *H01L 45/1608* (2013.01); *H01L 45/1691* (2013.01)

(56) References Cited

U.S. PATENT DOCUMENTS

| | | |
|---|---|---|
| 6,815,266 B2 | 11/2004 | Rodgers et al. |
| 6,815,705 B2 | 11/2004 | Klersy et al. |
| 6,864,503 B2 | 3/2005 | Lung |
| 6,867,425 B2 | 3/2005 | Wicker |
| 6,881,603 B2 | 4/2005 | Lai |
| 6,972,428 B2 | 12/2005 | Maimon |
| 7,023,014 B2 | 4/2006 | Morimoto et al. |
| 7,092,286 B2 | 8/2006 | Lowrey et al. |
| 7,119,353 B2 | 10/2006 | Lankhorst et al. |
| 7,138,687 B2 | 11/2006 | Lung et al. |
| 7,173,271 B2 | 2/2007 | Chang |
| 7,183,567 B2 | 2/2007 | Chiang |
| 7,214,958 B2 | 5/2007 | Happ |
| 7,227,170 B2 | 6/2007 | Ovshinsky |
| 7,227,221 B2 | 6/2007 | Ovshinsky |
| 7,352,037 B2 | 4/2008 | Kim et al. |
| 7,417,245 B2 | 8/2008 | Happ et al. |
| 7,419,881 B2 | 9/2008 | Cho et al. |
| 7,476,587 B2 | 1/2009 | Lung |
| 7,488,967 B2 | 2/2009 | Burr et al. |
| 7,504,652 B2 | 3/2009 | Huang |
| 7,521,372 B2 | 4/2009 | Chen |
| 7,521,706 B2 | 4/2009 | Jeong et al. |
| 7,529,123 B2 | 5/2009 | Ovshinsky et al. |
| 7,547,906 B2 | 6/2009 | Ovshinsky |
| 7,566,895 B2 | 7/2009 | Chen |
| 7,608,503 B2 | 10/2009 | Lung |
| 7,626,191 B2 | 12/2009 | Chao et al. |
| 7,670,869 B2 | 3/2010 | Yu |
| 7,678,606 B2 | 3/2010 | Chen |
| 7,679,163 B2 | 3/2010 | Chen et al. |
| 7,745,811 B2 | 6/2010 | Lee |
| 7,772,582 B2 | 8/2010 | Chen et al. |
| 7,800,092 B2 | 9/2010 | Liu et al. |
| 7,852,658 B2 | 12/2010 | Liu et al. |
| 7,858,961 B2 | 12/2010 | Chuang et al. |
| 7,897,952 B2 | 3/2011 | Wouters et al. |
| 7,910,905 B2 | 3/2011 | Liu |
| 7,919,768 B2 | 4/2011 | Chen |
| 7,923,714 B2 | 4/2011 | Hsu |
| 7,964,862 B2 | 6/2011 | Chen et al. |
| 8,426,838 B2 | 4/2013 | Chen et al. |
| 8,604,457 B2 | 12/2013 | Chen et al. |
| 8,716,099 B2 | 5/2014 | Chen et al. |
| 8,884,260 B2 | 11/2014 | Chen |
| 9,735,352 B2 | 8/2017 | Chen |
| 9,847,479 B2 * | 12/2017 | Chen ................ H01L 27/24 |
| 2002/0017701 A1 | 2/2002 | Klersy et al. |
| 2003/0062595 A1 | 4/2003 | Anthony |
| 2006/0108667 A1 | 5/2006 | Lung |
| 2006/0110878 A1 | 5/2006 | Lung et al. |
| 2006/0110888 A1 | 5/2006 | Cho et al. |
| 2006/0175599 A1 | 8/2006 | Happ |
| 2006/0284157 A1 | 12/2006 | Chen |
| 2006/0284158 A1 | 12/2006 | Lung |
| 2006/0284159 A1 | 12/2006 | Chang et al. |
| 2007/0012905 A1 | 1/2007 | Huang |
| 2007/0019479 A1 | 1/2007 | Kim et al. |
| 2007/0272950 A1 | 11/2007 | Kim et al. |
| 2007/0278529 A1 | 12/2007 | Lai |
| 2007/0281420 A1 | 12/2007 | Lai |
| 2007/0291533 A1 | 12/2007 | Chuo |
| 2008/0081473 A1 | 4/2008 | Suzuki |
| 2008/0138929 A1 | 6/2008 | Lung |
| 2008/0138930 A1 | 6/2008 | Lung |
| 2008/0272355 A1 | 11/2008 | Cho et al. |
| 2008/0303014 A1 | 12/2008 | Goux et al. |
| 2008/0308782 A1 | 12/2008 | Shue et al. |
| 2009/0098716 A1 | 4/2009 | Lung |
| 2009/0104771 A1 | 4/2009 | Lung |
| 2009/0189140 A1 | 7/2009 | Chen |
| 2009/0189142 A1 | 7/2009 | Chen |
| 2009/0227066 A1 | 9/2009 | Joseph et al. |
| 2010/0006814 A1 | 1/2010 | Chen et al. |
| 2010/0117050 A1 | 5/2010 | Chen et al. |
| 2010/0148141 A1 | 6/2010 | Lee et al. |
| 2013/0196467 A1 | 8/2013 | Chen |
| 2014/0175370 A1 | 6/2014 | Chen |
| 2015/0041752 A1 | 2/2015 | Chen |

FOREIGN PATENT DOCUMENTS

| | | |
|---|---|---|
| CN | 101211959 A | 7/2008 |
| CN | 101308903 A | 11/2008 |
| CN | 101383397 A | 3/2009 |
| CN | 101504968 A | 8/2009 |
| CN | 101626060 A | 1/2010 |
| CN | 101740716 A | 6/2010 |
| JP | 2002246561 | 8/2002 |
| JP | 2004274055 | 9/2004 |
| JP | 2005525690 A | 8/2005 |
| JP | 2006510220 A | 3/2006 |
| JP | 2006108645 | 4/2006 |
| JP | 2006295168 | 10/2006 |
| JP | 2007103945 | 4/2007 |
| JP | 2007509489 A | 4/2007 |
| JP | 2007184591 | 7/2007 |
| JP | 2007243169 A | 9/2007 |
| JP | 2008283163 A | 9/2007 |
| JP | 2008078625 A | 4/2008 |
| JP | 2008085204 A | 4/2008 |
| JP | 2008091870 A | 4/2008 |
| JP | 2008530790 A | 8/2008 |
| TW | 200828506 A | 7/2008 |
| TW | 200845443 A | 11/2008 |
| TW | 200913252 A | 3/2009 |
| TW | 200937693 A | 9/2009 |
| TW | 201003851 A | 1/2010 |
| TW | 201019467 A | 5/2010 |
| WO | 2006084856 A1 | 8/2006 |

OTHER PUBLICATIONS

Schwabe Williamson & Wyatt, "Listing of Related Cases", dated Feb. 28, 2018; 1 page.

* cited by examiner

PHASE CHANGE MEMORY ELEMENT

CROSS-REFERENCE TO RELATED APPLICATION

This application is a continuation of Ser. No. 15/655,134, filed Jul. 20, 2017, now pending, which is a continuation of Ser. No. 14/981,075, filed Dec. 28, 2015, now U.S. Pat. No. 9,735,352, which is a continuation of U.S. patent application Ser. No. 14/522,057, filed Oct. 23, 2014, now U.S. Pat. No. 9,245,924, which is a divisional of U.S. patent application Ser. No. 14/062,793, filed Oct. 24, 2013, now U.S. Pat. No. 8,884,260, which is a divisional of U.S. patent application Ser. No. 12/269,282, filed Nov. 12, 2008, now U.S. Pat. No. 8,604,457, all the disclosures of which are hereby incorporated by reference in their entirety.

BACKGROUND OF THE INVENTION

1. Field of the Invention

The invention relates to a memory element, and more particularly to a phase-change memory element.

2. Description of the Related Art

Phase-change memory technology requires high reliability, high speeds, low current, and low operating voltage, in order to function as a viable alternative to current memory technologies such as flash and DRAM. A phase-change memory cell must therefore provide low programming current, voltage operation, a smaller cell size, a fast phase transformation speed, and a low cost. These requirements are difficult to meet given the current state of the art.

The phase-change memory structures are predominantly self-heating, i.e. current flows through the phase-change material to produce the required heat. The top electrical contact of the phase-change memory is generally wider than the bottom electrical contact area. The structure may be a pore filled with phase-change material, or a block of phase-change material with a sublithographic bottom contact, and lithographically defined top electrode. The wider contact defines the maximum current required to write a bit to the cell. Variations in the bottom or top contact width due to lithography, etching or other processing stages result in variations of the required programming current.

Ideally, the phase-change memory will have a fixed cross-section area, such as a pillar or bridge. However these structures tend to require high voltages as the cross-section area and/or the length is reduced. An issue limiting further advancement is that the electrodes connecting to the structure, act as heat sinks.

Macronix (U.S. Pub. 20060284157 and U.S. Pub. 20060284158) disclosed a basic phase-change bridge structure. However, the electrode contacts are the only contacts to the bridge and heat significantly flows out through these contacts, thus making programming very inefficient.

U.S. Pat. No. 7,119,353 discloses a phase change memory element, including a substrate, a CMOS formed on the substrate, a dielectric layer, a metal plug, and a phase change memory cell. Particularly, the phase change memory cell includes a phase change material layer, and a pair of electrodes. The CMOS electrically connects to the electrode of the phase change memory cell via the metal plug. Accordingly, the active area (phase change area) can be determined by the thickness of the phase change material layer. The contact surface between the phase change material layer and the metal plug, however, is limited by the diameter of the metal plug, thereby making it unable to increase heating efficiency and reducing the programming current of the phase change memory cells.

Therefore, it is desirable to devise a phase-change memory cell structure that improves upon the aforementioned problems.

BRIEF SUMMARY OF THE INVENTION

An exemplary embodiment of a phase-change memory element includes: a first electrode and a second electrode; a phase-change material layer electrically connected to the first electrode and the second electrode; and at least two electrically isolated conductors, disposed between the first electrode and the second electrode, directly contacting the phase-change material layers.

An exemplary embodiment provides a method for forming a phase-change memory element, including providing a substrate; forming a dielectric layer on the substrate; forming a first electrode and a second electrode on the dielectric layer; forming at least two electrically isolated conductors on the dielectric layer, disposed between and separated from the first electrode and the second electrode; and forming a phase-change material layer electrically connected to the first electrode and the second electrode, directly contacting the phase-change material layer.

Another exemplary embodiment provides a method for forming phase-change memory element, including providing a substrate; forming a bottom electrode on the substrate; forming a first thermal insulator on the first electrode; forming a first electrically isolated conductor on the first thermal insulator; forming a dielectric layer on the first electrically isolated conductor; forming a second electrically isolated conductor on the dielectric layer; forming a second thermal insulator on the second electrically isolated conductor; forming a top electrode on the second thermal insulator; and forming a phase-change spacer to cover the side of above structure.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
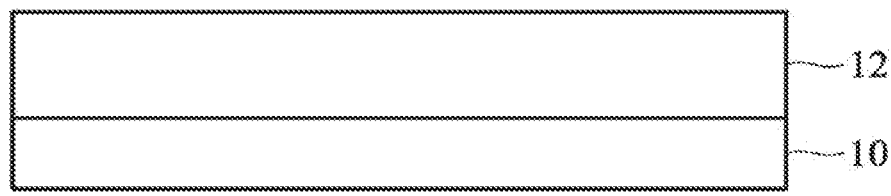
FIGS. 1a-1j are cross sections of a method for fabricating a phase-change memory element according to an embodiment of the invention.

First, referring to FIG. 1a, a substrate 10 with a dielectric layer 12 is provided. Particularly, the substrate 10 can be a substrate employed in a semiconductor process, such as silicon substrate. The substrate 10 can include a complementary metal oxide semiconductor (CMOS) circuit, an isolation structure, a diode, a transistor, or a capacitor (not shown). Suitable material for the dielectric layer 12 can include silicon dioxide.

Figure 1B:
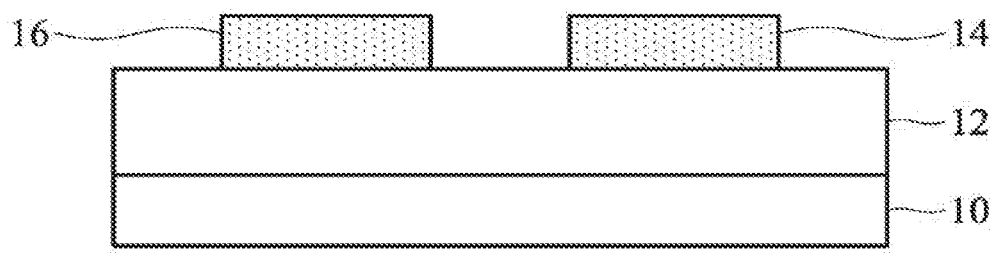

Next, referring to FIG. 1b, a pair of first and second electrodes 14 and 16 is formed on the dielectric layer 12 and separated from each other. Suitable material for the first and second electrodes 14 and 16, for example, can be Al, W, Mo, Ti, TiN, TiAlN, TiW or TaN. The first electrode 14 may be electrically connected to lower layers of the substrate via a contact (not shown). The first and second electrodes 14 and 16 are formed by the same material and by the same process, and are coplanar.

Figure 1C:
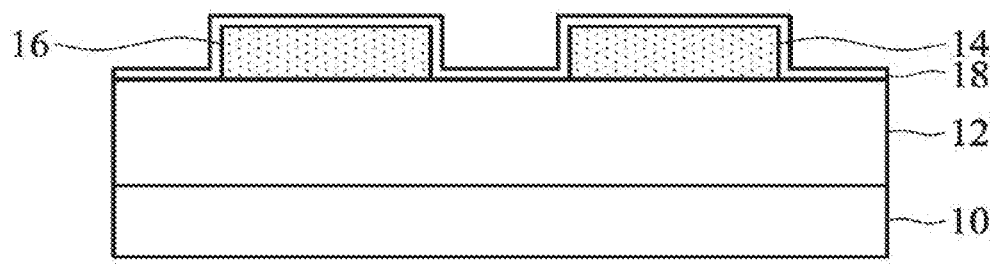

Next, referring to FIG. 1c, a dielectric layers 18 is conformally formed on the substrate 10, covering the dielectric layer 12 and the first and second electrodes 14 and 16. The dielectric layer 18 can include silicon nitride, in order to prevent a subsequently formed metal layer from contacting the first and second electrodes 14 and 16. The thickness of the dielectric layers 18 can be 10-50 nm.

Figure 1D:
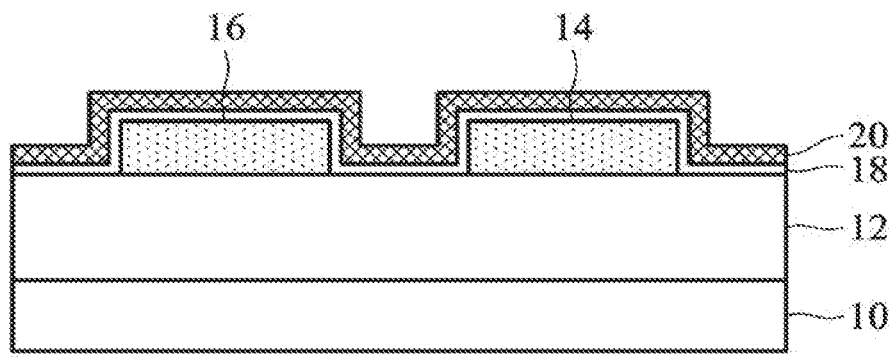

Next, referring to FIG. 1d, a metal layer 20 is conformally formed on the dielectric layers 18. The thickness of the metal layer 20 can be 10-50 nm. Suitable material of the metal layer includes Al, W, Mo, Ti, TiN, TiAlN, TiW or TaN.

Figure 1E:
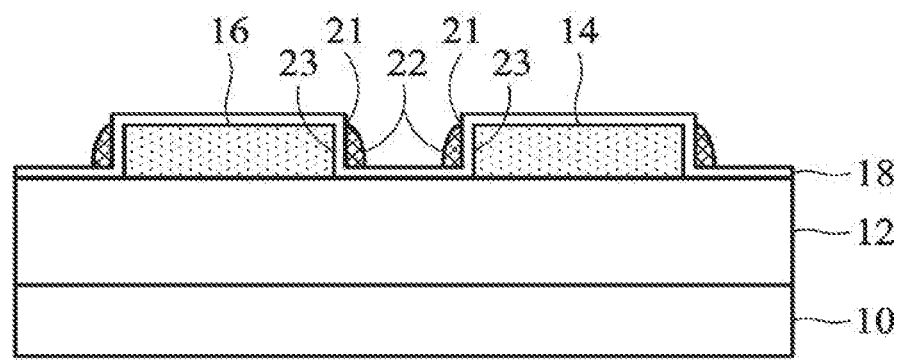

Next, referring to FIG. 1e, an etching process (such as an anisotropic etching process) is subjected to the metal layer 20, leaving a plurality of metal spacers 22 with a pointed top 21 sitting on the dielectric layer 18 adjacent to the side walls 23 of the first and second electrodes 14 and 16.

Figure 1F:
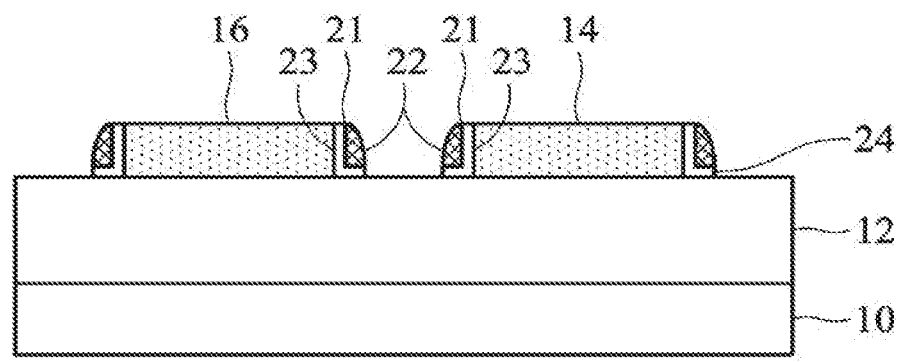

Next, referring to FIG. 1f, another etching process (such as an anisotropic etching process) is subjected to the dielectric layers 18, patterning the dielectric layers 18 leaving a patterned dielectric layers 24.

Figure 1G:
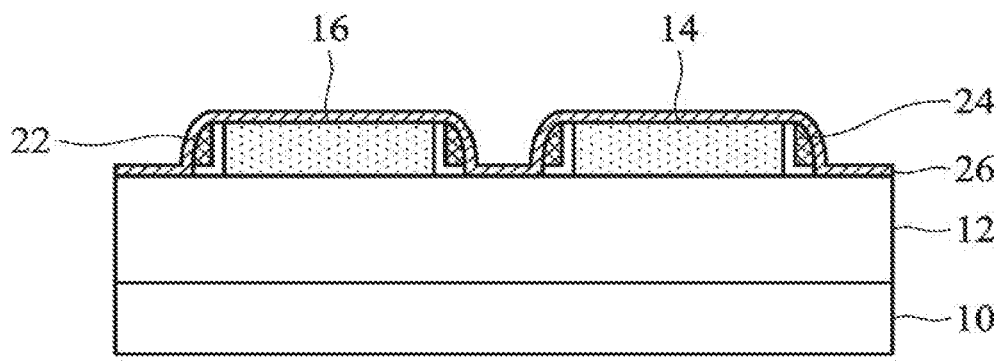

Next, referring to FIG. 1g, a phase-change material layer 26 is conformally formed on the above substrate. The phase-change material layer 26 can include In, Ge, Sb, Te, Sn, Ga or combinations thereof, such as GeSbTe or InGeSbTe. It should be noted that there are two metal spacers 22 between the first and second electrodes 14 and 16 and the pointed top 21 and the side-walls of the two metal spacers 22 directly contact to the phase-change material layer 26. Since the two metal spacers 22 are disconnected electrically from other components except for the phase-change material layer 26, the two metal spacers 22 can serve as electrically isolated conductors of the phase-element. The thickness of the phase-change material layer 26 can be 0.5-10 nm.

Figure 1H:
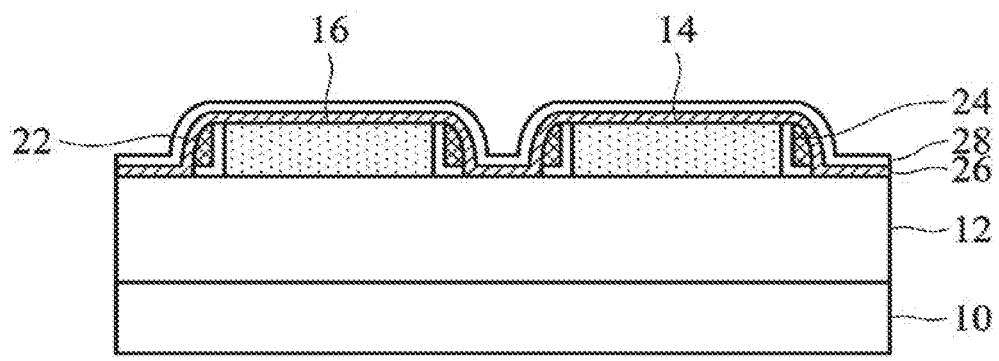

Next, referring to FIG. 1h, a dielectric layer 28 is conformally formed on the phase-change material layer 26. The dielectric layer 28 can include silicon nitride or the same material as the dielectric layer 18.

Figure 1I:
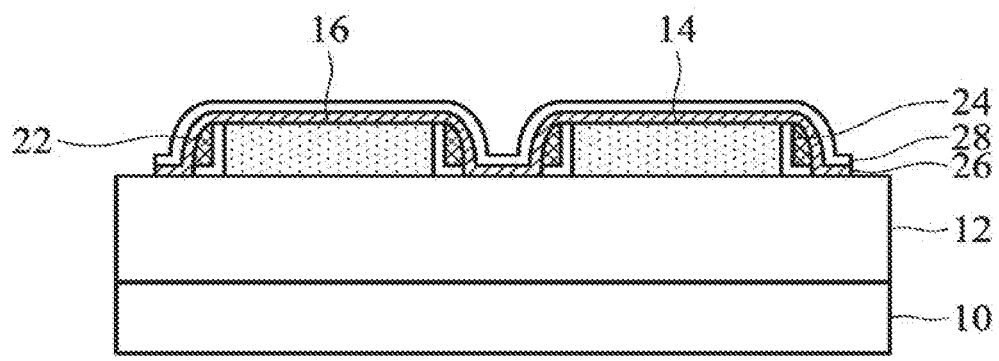

Next, referring to FIG. 1i, the phase-change material layer 26 is patterned by lithography (such as one or two photomasks) to span the first and second electrodes 14 and 16 and have a bridge width comparable to a design rule. The phase-change bridge structure is therefore self-aligned to the electrodes. The dielectric layer 28 can include silicon nitride or the same material as the dielectric layer 18.

Figure 1J:
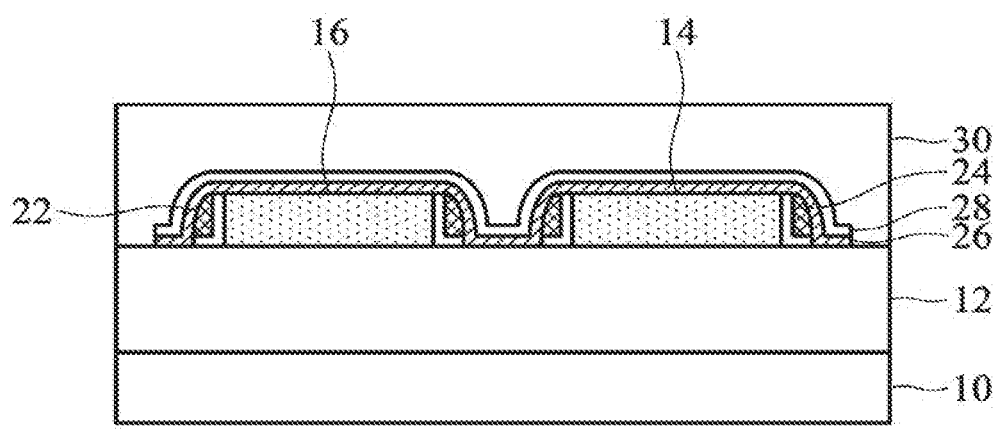

Finally, referring to FIG. 1j, a dielectric layer 30 is formed on the above structure and planarized by a chemical mechanical planarization (CMP) process. The dielectric layer 30 can be silicon dioxide or the same material as the dielectric layer 12. The dielectric layer 30, dielectric layer 28 and the phase-change material layer 26 over the second electrode 16 may be patterned to form a via and the second electrode 16 can be electrically connected to a conductive layer via a contact (not shown).

Figure 2:
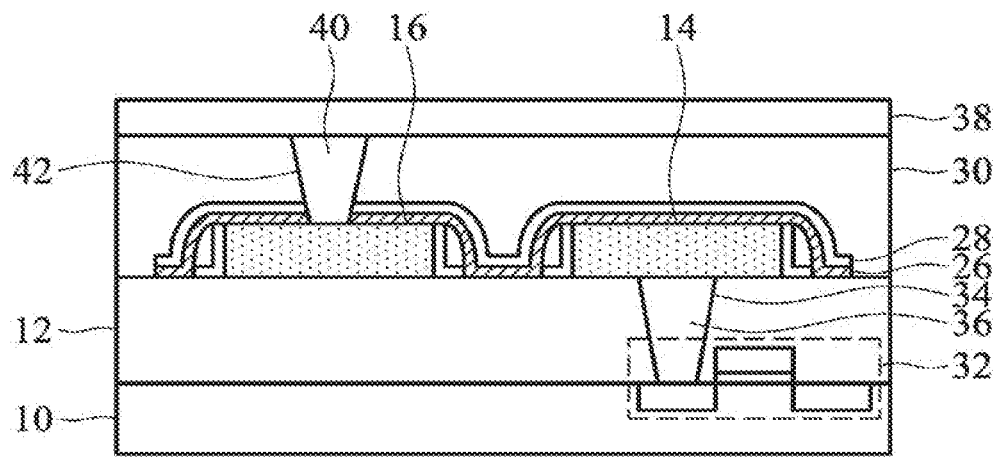
FIG. 2 is a cross section of a device including the phase change memory element of the invention.

According to an embodiment of the invention, referring to FIG. 2, a device including the aforementioned phase change memory element is disclosed. The device includes a substrate having a transistor 32 formed thereon, wherein the transistor 32 is electrically connected to the first electrode 14 of the aforementioned phase-change memory element via a metal plug 34 with the contact hole 36. The transistor 32 can further be electrically connected to a word line. Further, the device includes a bit line 38 electrically connected to the second electrode 16 of the aforementioned phase-change memory element via a metal plug 42 with the contact hole 40.

Figure 3:
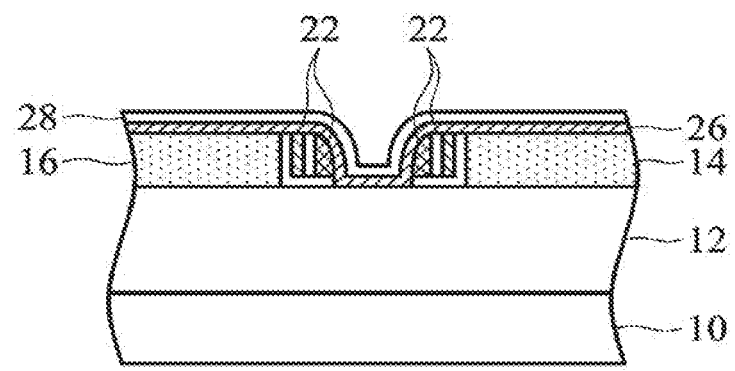
FIG. 3 is a cross section of a phase-change memory element according to another embodiment of the invention.

In another embodiment of the invention, referring to FIG. 3, the phase-change memory can have more than two metal spacers 22 between the first and second electrodes 14 and 16 to contact the phase-change material layer 26, serving as electrically isolated conductors for multi-level operation.

Moreover, the invention also provides another phase-change memory element with the fabricating steps as below.

Figure 4A:
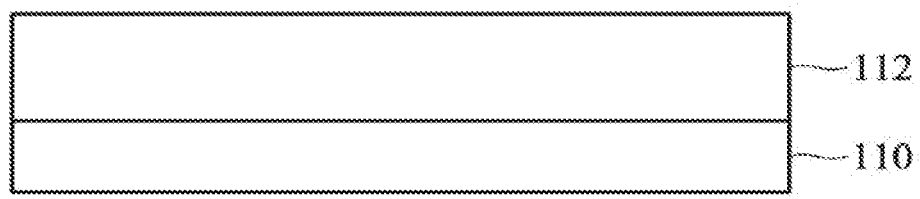
FIG. 4a-4j are cross sections of a method for fabricating a phase-change memory element according to yet another embodiment of the invention.

First, referring to FIG. 4a, a substrate 110 with a dielectric layer 112 is provided. Particularly, the substrate 110 can be a substrate employed in a semiconductor process, such as silicon substrate. The substrate 110 can include a complementary metal oxide semiconductor (CMOS) circuit, an isolation structure, a diode, a transistor, or a capacitor (not shown). Suitable material for the dielectric layer 112 can include silicon dioxide.

Figure 4B:
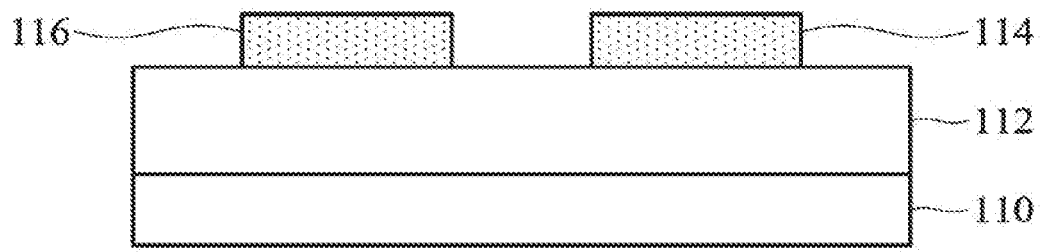

Next, referring to FIG. 4b, a pair of first and second electrodes 114 and 116 is formed on the dielectric layer 112 and is separated from each other. Suitable material for the first and second electrodes 114 and 116, for example, can be Al, W, Mo, Ti, TiN, TiAlN, TiW or TaN. The first electrode 114 may be electrically connected to lower layers of the substrate via a contact (not shown). The first and second electrodes 114 and 116 are formed by the same material and by the same process, and are coplanar.

Figure 4C:
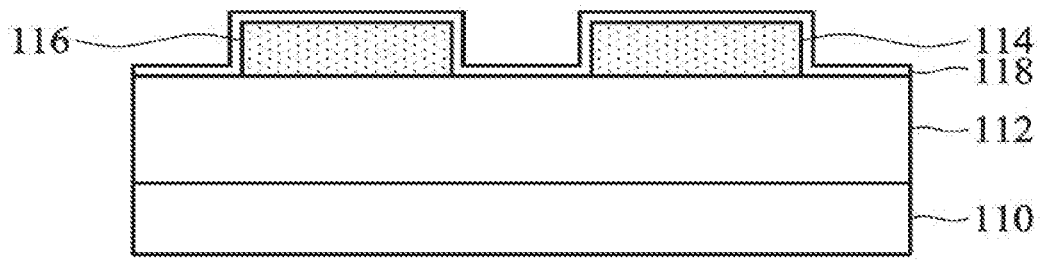

Next, referring to FIG. 4c, a dielectric layers 118 is conformally formed on the substrate 110, covering the dielectric layer 112 and the first and second electrodes 114 and 116. The dielectric layer 118 can include silicon nitride, in order to prevent a subsequently formed metal layer from contacting the first and second electrodes 114 and 116. The thickness of the dielectric layers 118 can be 10-50 nm.

Figure 4D:
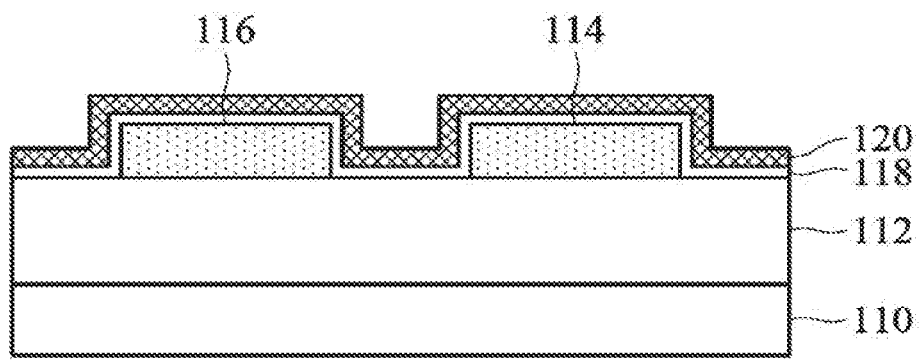

Next, referring to FIG. 4d, a metal layer 120 is conformally formed on the dielectric layers 118. The thickness of the metal layer 120 can be 10-50 nm.

Figure 4E:
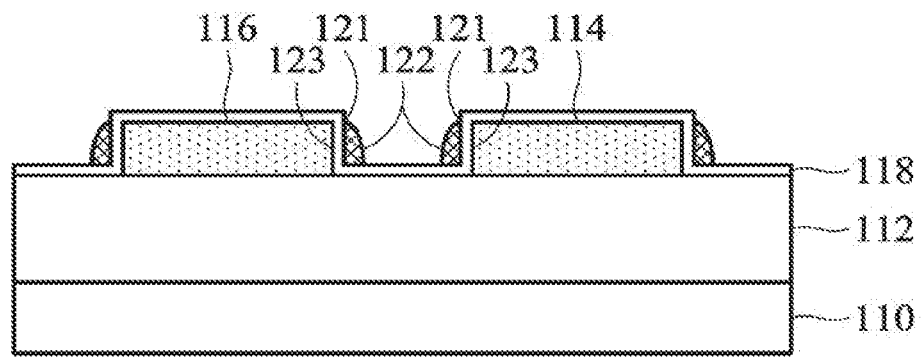

Next, referring to FIG. 4e, an etching process (such as an anisotropic etching process) is subjected to the metal layer 120, leaving a plurality of metal spacers 122 with a pointed top 121 sitting on the dielectric layer 118 adjacent to the side walls 123 of the first and second electrodes 114 and 116.

Figure 4F:
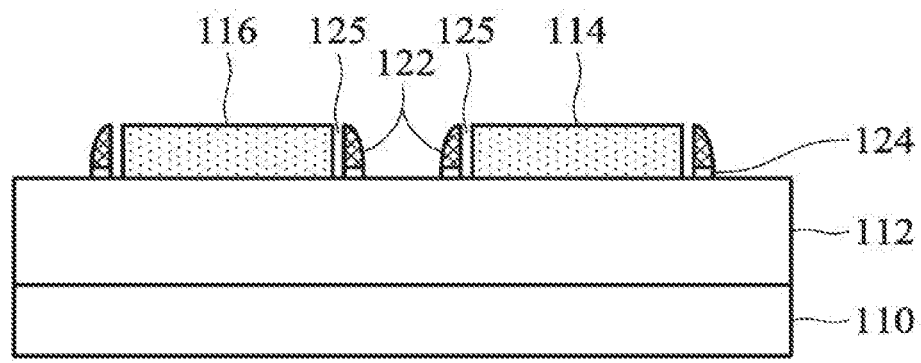

Next, referring to FIG. 4f, another etching process (such as an anisotropic etching process) is subjected to the dielectric layers 118, patterning the dielectric layers 118 as the metal spacer as a mask, leaving a patterned dielectric layers 124. Particularly, the patterned dielectric layers 124 and the adjacent electrode are separated by trenches 125.

Figure 4G:
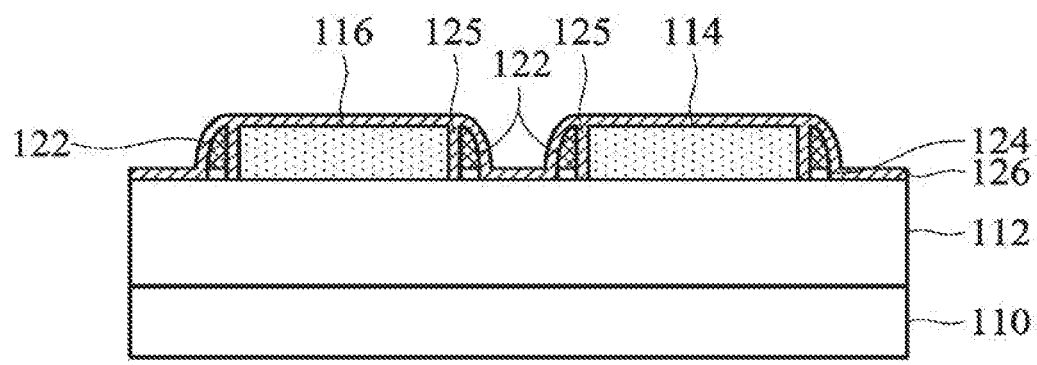

Next, referring to FIG. 4g, a phase-change material layer 126 is conformally formed on the above substrate and fills the trenches 125. The phase-change material layer 126 can include In, Ge, Sb, Te, Sn, Ga or combinations thereof, such as GeSbTe or InGeSbTe. It should be noted that there are two metal spacers 122 between the first and second electrodes 114 and 116 and the pointed top 121 and the sidewalls of the two metal spacers 122 directly contact two the phase-change material layer 126. It should be noted that each metal spacer 122 and the electrode adjacent thereto are separated by the phase-change material layer 126 filled into the trenches. Since the two metal spacers 122 are disconnected electrically from other components except for the phase-change material layer 126, the two metal spacers 122 can serve as electrically isolated conductors of the phase-element. The thickness of the phase-change material layer 126 can be 0.5-10 nm.

Figure 4H:
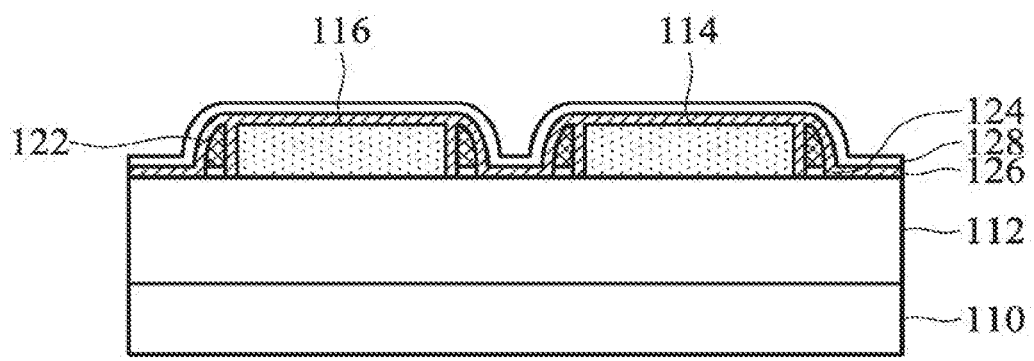

Next, referring to FIG. 4h, a dielectric layer 128 is conformally formed on the phase-change material layer 126. The dielectric layer 128 can include silicon nitride or the same material as the dielectric layer 118.

Figure 4I:
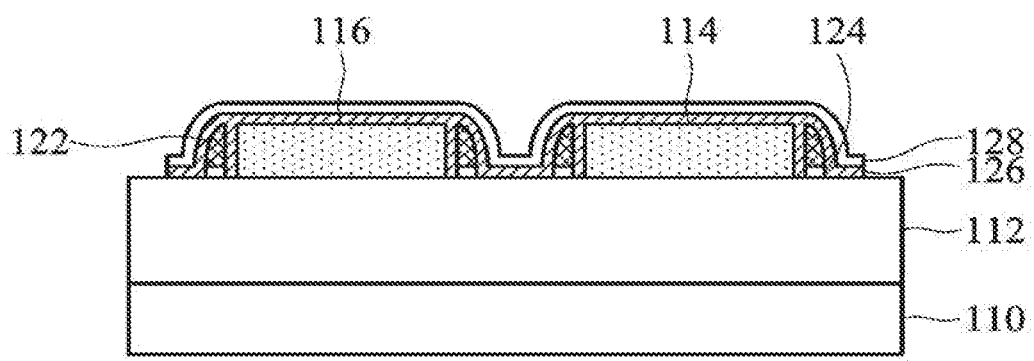

Next, referring to FIG. 4i, the phase-change material layer 126 is patterned by lithography (such as one or two photomask) to span the first and second electrodes 114 and 116 and have a bridge width comparable to a design rule. The phase-change bridge structure is therefore self-aligned to the electrodes. The dielectric layer 128 can include silicon nitride or the same material as the dielectric layer 118.

Figure 4J:
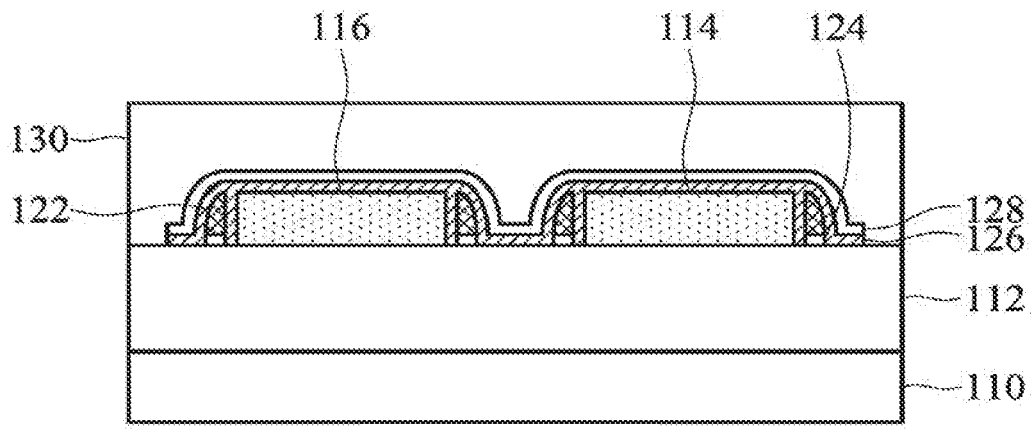

Finally, referring to FIG. 4j, a dielectric layer 130 is formed on the above structure and planarized by a chemical mechanical planarization (CMP) process. The dielectric layer 130 can be silicon dioxide or the same material as the dielectric layer 112. The dielectric layer 130, dielectric layer 128 and the phase-change material layer 126 over the second electrode 116 may be patterned to form a via and the second electrode 116 can be electrically connected to a conductive layer of complementary metal oxide semiconductor (CMOS) circuit, an isolation structure, a diode, a transistor, or a capacitor (not shown) via a contact.

Figure 5:
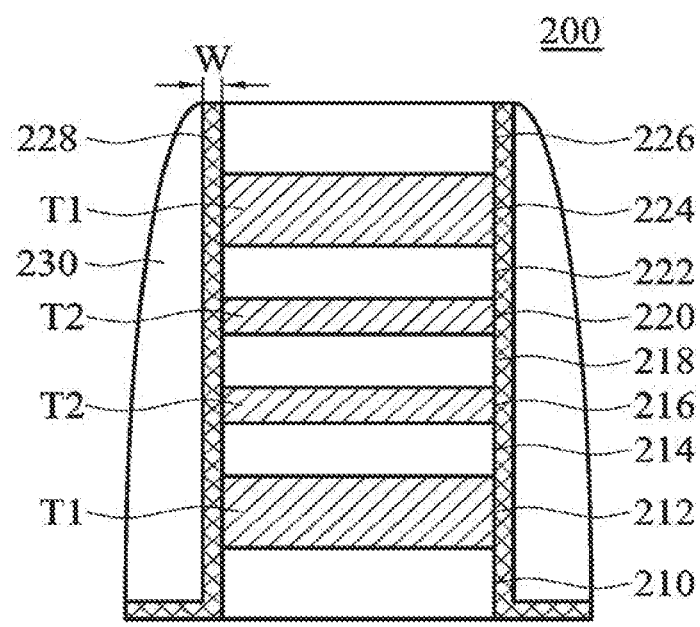
FIG. 5 is a cross section of a phase-change memory element with electrically isolated conductors having a pillar structure according to embodiments of the invention.

According to embodiments of the invention, a phase-change memory element 200 with electrically isolated conductors can have a pillar structure, as shown in FIG. 5.

Referring to FIG. 5, the phase-change memory element 200 includes, from bottom to top, a bottom electrode 210, a first thermal insulator 212, a first dielectric layer 214, a first electrically isolated conductor 216, a second dielectric layer 218, a second electrically isolated conductor 220, a third dielectric layer 222, a second thermal insulator 224, and a top electrode 226. The phase-change memory element 200 further includes phase-change material spacers 228 covering all side walls of the above components, and a dielectric spacer 230 covering the phase-change material spacers. The bottom and top electrodes 210 and 226 can be independent and include Al, W, Mo, Ti, TiN, TiAlN, TiW or TaN. The first and second thermal insulators 212 and 224 can be a dielectric layer with low thermal conductivity or phase-change material. The dielectric layer 218 can be silicon dioxide. The first and second electrically isolated conductors 216 and 220 can be metal or phase-change material; phase-change material can include In, Ge, Sb, Te, Sn, Ga or combinations thereof, such as GeSbTe or InGeSbTe.

In the embodiment, the thermal insulator slows heating of the electrically isolated conductors and the phase-change area is confined to in-between the electrically isolated metal.

It should be noted that the width W of the phase-change material spacers 228 must be less than the thickness T2 of the first and second electrically isolated conductors 216 and 220. When the first and second thermal insulators 212 and 224 are phase-change material, the width W of the phase-change material spacers 228 must be less than the thickness T1 of the first and second thermal insulators 212 and 224.

For example, the width W of the phase-change material spacers 228 can be 2-5 nm, the thickness T2 of the first and second crystallization initiators 216 and 220 are 15 nm, and the thickness T1 of the first and second thermal insulators 212 and 224 are 15 nm.

Accordingly, the phase-change memory element of the invention allows reduction of current and voltage and thermal non-uniformity in the programming region through manufacturing processes. Further, multi-bit capability is also possible. The bridge embodiment is not affected by the top contact critical dimension (CD) and bottom contact critical dimension (CD) variation issue.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A phase-change memory, comprising:
   a plurality of electrodes;
   a phase-change material that contacts the plurality of electrodes; and
   at least one conductor that contacts the phase-change material;
   wherein the at least one conductor is electrically connected to the plurality of electrodes only through the phase-change material.

2. The phase-change memory of claim 1, wherein the plurality of electrodes are co-planar and formed on a substrate.

3. The phase-change memory of claim 1, wherein the plurality of electrodes are formed on a dielectric layer that is formed on a substrate.

4. The phase-change memory of claim 1, further comprising a dielectric layer formed on sidewalls of each electrode of the plurality of electrodes.

5. The phase-change memory of claim 1, wherein the at least one conductor comprises a plurality of conductors.

6. The phase-change memory of claim 5, wherein the plurality of conductors comprises four conductors.

7. The phase-change memory of claim 1, wherein a first electrode of the plurality of electrodes is formed above a second electrode of the plurality of electrodes.

8. The phase-change memory of claim 1, wherein the phase change material comprises In, Ge, Sb, Te, Ga, Sn, or combinations thereof.

9. The phase-change memory of claim 1, wherein the plurality of electrodes comprises Al, W, Mo, Ti, TiN, TiAlN, TiW, or TaN.

10. The phase-change memory of claim 1, further comprising:
    a substrate below the plurality of electrodes; and
    a transistor formed on a surface of the substrate, wherein a source or a drain of the transistor is electrically connected to an electrode of the plurality of electrodes.

11. The phase-change memory of claim 10, wherein at least a portion of the transistor is located below the surface of the substrate.

12. The phase-change memory of claim 1, further comprising:
    a substrate below the plurality of electrodes; and
    a diode formed on a surface of the substrate, wherein a terminal of the diode is electrically connected to an electrode of the plurality of electrodes.

13. The phase-change memory of claim 1, further comprising:
a substrate below the plurality of electrodes; and
a complementary metal oxide semiconductor (CMOS) circuit formed on a surface of the substrate, wherein a terminal of the CMOS circuit is electrically connected to an electrode of the plurality of electrodes.

14. The phase-change memory of claim 1, wherein an electrode of the plurality of electrodes is electrically connected to a bit line via a metal plug.

15. The phase-change memory of claim 1, wherein the at least one conductor comprises a pair of conductors, and wherein a first conductor of the pair of conductors is electrically connected to a second conductor of the pair of conductors only through the phase-change material.

16. The phase-change memory of claim 15, wherein the pair of conductors comprises a first pair of conductors, wherein the at least one conductor further comprises a second pair of conductors, and wherein a first conductor of the second pair of conductors is electrically connected to a second conductor of the second pair of conductors only through the phase-change material.

17. The phase-change memory of claim 1, wherein the at least one conductor comprises a plurality of conductors, wherein a first conductor of the plurality of conductors has a first shape and a second conductor of the plurality of conductors has a second shape that is different than the first shape, and wherein the first conductor is electrically connected to the second conductor only through the phase-change material.

18. The phase-change memory of claim 17, wherein the first shape includes a pointed top.

19. The phase-change memory of claim 17, wherein a memory cell corresponding to the plurality of conductors comprises a multi-level memory cell.

20. The phase-change memory of claim 1, wherein a portion of the phase-change material is located between a conductor of the at least one conductor and an electrode of the plurality of electrodes.

* * * * *